(12) United States Patent
Hill et al.

(10) Patent No.: US 8,470,686 B2
(45) Date of Patent: *Jun. 25, 2013

(54) METHOD OF INCREASING DEPOSITION RATE OF SILICON DIOXIDE ON A CATALYST

(75) Inventors: Chris W. Hill, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/448,676

(22) Filed: Apr. 17, 2012

(65) Prior Publication Data

US 2012/0202359 A1 Aug. 9, 2012

Related U.S. Application Data

(63) Continuation of application No. 10/930,149, filed on Aug. 31, 2004, now Pat. No. 8,158,488.

(51) Int. Cl.
*H01L 21/76* (2006.01)

(52) U.S. Cl.
USPC ........... 438/435; 438/424; 438/438; 438/437; 438/296

(58) Field of Classification Search
USPC .......................... 438/778, 909, 935, 685, 680
See application file for complete search history.

(56) References Cited

U.S. PATENT DOCUMENTS

| | | | |
|---|---|---|---|
| 5,403,630 A | 4/1995 | Matsui et al. | |
| 5,710,075 A | 1/1998 | Tseng | |
| 5,804,455 A | 9/1998 | Liu | |
| 5,916,365 A | 6/1999 | Sherman | |
| 6,037,003 A | 3/2000 | Gordon et al. | |
| 6,090,442 A | 7/2000 | Klaus et al. | |
| 6,097,403 A | 8/2000 | McMinn | |
| 6,294,423 B1 | 9/2001 | Malik et al. | |
| 6,387,269 B1 | 5/2002 | Eltner et al. | |
| 6,437,417 B1 | 8/2002 | Gilton | |
| 6,465,828 B2 | 10/2002 | Agarwal | |
| 6,475,910 B1 * | 11/2002 | Sneh | 438/685 |
| 6,511,539 B1 | 1/2003 | Raaijmakers | |
| 6,534,395 B2 | 3/2003 | Werkhoven et al. | |
| 6,596,133 B1 | 7/2003 | Moslehi et al. | |
| 6,596,636 B2 | 7/2003 | Sandhu et al. | |
| 6,602,807 B2 | 8/2003 | Budge et al. | |
| 6,638,862 B2 | 10/2003 | Sneh | |
| 6,673,701 B1 | 1/2004 | Marsh et al. | |
| 6,743,681 B2 | 6/2004 | Bhattacharyya | |

(Continued)

FOREIGN PATENT DOCUMENTS

WO 03083167 A1 10/2003

*Primary Examiner* — Steven Loke
*Assistant Examiner* — David Goodwin
(74) *Attorney, Agent, or Firm* — TraskBritt

(57) ABSTRACT

Methods for forming dielectric layers, and structures and devices resulting from such methods, and systems that incorporate the devices are provided. The invention provides an aluminum oxide/silicon oxide laminate film formed by sequentially exposing a substrate to an organoaluminum catalyst to form a monolayer over the surface, remote plasmas of oxygen and nitrogen to convert the organoaluminum layer to a porous aluminum oxide layer, and a silanol precursor to form a thick layer of silicon dioxide over the porous oxide layer. The process provides an increased rate of deposition of the silicon dioxide, with each cycle producing a thick layer of silicon dioxide of about 120 Å over the layer of porous aluminum oxide.

22 Claims, 3 Drawing Sheets

U.S. PATENT DOCUMENTS

| | | |
|---|---|---|
| 6,750,110 B1 | 6/2004 | Derderian |
| 6,753,271 B2 | 6/2004 | Sarigiannis et al. |
| 6,759,306 B1 | 7/2004 | Sharan et al. |
| 6,844,260 B2 | 1/2005 | Sarigiannis et al. |
| 6,846,516 B2 | 1/2005 | Yang et al. |
| 6,861,334 B2 * | 3/2005 | Raaijmakers et al. ......... 438/435 |
| 6,867,152 B1 * | 3/2005 | Hausmann et al. ........... 438/778 |
| 6,882,025 B2 | 4/2005 | Yeo et al. |
| 6,893,978 B1 | 5/2005 | Kula |
| 7,081,395 B2 | 7/2006 | Chi et al. |
| 7,097,878 B1 * | 8/2006 | Rulkens et al. .......... 427/255.11 |
| 7,135,418 B1 * | 11/2006 | Papasouliotis ................ 438/778 |
| 7,202,185 B1 * | 4/2007 | Hausmann et al. ........... 438/778 |
| 7,208,413 B2 | 4/2007 | Byun et al. |
| 7,211,508 B2 | 5/2007 | Chung et al. |
| 2002/0018849 A1 | 2/2002 | George et al. |
| 2002/0031618 A1 | 3/2002 | Sherman |
| 2002/0081394 A1 | 6/2002 | Joo et al. |
| 2004/0038525 A1 | 2/2004 | Meng et al. |
| 2004/0043149 A1 | 3/2004 | Gordon et al. |
| 2004/0075751 A1 | 4/2004 | Takahashi |
| 2004/0083963 A1 | 5/2004 | Dando et al. |
| 2004/0131763 A1 | 7/2004 | Marsh |
| 2004/0147103 A1 | 7/2004 | Li et al. |
| 2005/0022739 A1 | 2/2005 | Carpenter et al. |
| 2005/0023584 A1 | 2/2005 | Derderian et al. |
| 2005/0039674 A1 | 2/2005 | Castovillo et al. |
| 2005/0042374 A1 | 2/2005 | Sarigiannis et al. |
| 2005/0054213 A1 | 3/2005 | Derderian et al. |
| 2005/0112282 A1 | 5/2005 | Gordon et al. |
| 2005/0123690 A1 | 6/2005 | Derderian |
| 2005/0126585 A1 | 6/2005 | Sarigiannis et al. |
| 2005/0151218 A1 | 7/2005 | Mouli |
| 2005/0186731 A1 | 8/2005 | Derderian et al. |
| 2007/0023856 A1 | 2/2007 | Sandhu |

* cited by examiner

METHOD OF INCREASING DEPOSITION RATE OF SILICON DIOXIDE ON A CATALYST

CROSS-REFERENCE TO RELATED APPLICATION

This application is a continuation of U.S. patent application Ser. No. 10/930,149, filed Aug. 31, 2004, now U.S. Pat. No. 8,158,488, issued Apr. 17, 2012.

TECHNICAL FIELD

The invention relates generally to semiconductor processing methods of forming dielectric fill materials and, more particularly, to methods of forming silicon dioxide layers on substrates using a catalyst.

BACKGROUND

Insulative materials are widely used in semiconductor fabrication methods for forming structures to electrically isolate the various active components formed in integrated circuits. Devices that extend into a semiconductive substrate can be electrically isolated by insulative materials formed within the substrate between the components, for example, trench isolation regions. In such a technique, trenches are etched into a silicon substrate, usually by anisotropic etching, and the trenches are subsequently filled by the deposition of an oxide such as silicon dioxide ($SiO_2$).

Due to the reduction in component size, microelectronic devices now require processing methods for forming nano-sized components and accompanying silicon dioxide films. Such films have been achieved using atomic layer deposition (ALD) to control the growth of the film.

ALD processes proceed by chemisorption of a monolayer of reactive precursor molecules at the surface of the substrate. A series of reactive precursors are then alternately pulsed into a deposition chamber, separated by an inert gas purge. Each pulse of a precursor results in a new atomic layer over the previously deposited layers. The cycle is repeated until a desired film thickness is achieved.

However, the rate of deposition of silicon dioxide to fill a trench or other opening using an ALD process is less than desirable.

SUMMARY

The present invention provides methods of forming insulative materials, and semiconductor devices and systems incorporating the insulative materials. In particular, the invention provides methods for forming a thick dielectric film utilizing a catalyst layer of an organoaluminum compound.

To form the dielectric layer according to the invention, alternating thin layers of aluminum oxide and thick layers of silicon dioxide are formed by pulsing an organoaluminum precursor into a deposition chamber for a set period of time to deposit a monolayer of the organoaluminum (catalyst) material over the substrate, purging the unreacted organoaluminum precursor material from the chamber, pulsing an active oxygen and active nitrogen source into the chamber for a set period of time to oxidize and convert the organoaluminum monolayer to a porous aluminum oxide layer, and then pulsing a silanol precursor into the chamber for a set period of time to deposit the silanol material onto the porous aluminum oxide layer to grow a thick layer of silicon dioxide.

In one embodiment of the method of the invention, trimethylaluminum (TMA) catalyst or triethyl(tri-sec-butoxy)dialuminum (TETBAL) catalyst is deposited as a monolayer over the substrate, unreacted catalyst is purged from a deposition chamber, the catalyst layer on the substrate is exposed to a remote plasma oxygen source gas (e.g., $O_3$) and a small amount of a remote plasma nitrogen source gas (e.g., $N_2$), preferably containing less than about 1% nitrogen, to convert the layer to a porous aluminum oxide layer, and a silanol precursor gas such as tris(tert-butoxy)silanol (TBOS) is deposited onto the porous aluminum oxide layer to form a thick silicon dioxide ($SiO_2$) layer. The unreacted silanol material can then be purged from the deposition chamber, and the cycle or sequence of depositing a monolayer of the TMA or TETBAL catalyst, purging the chamber, exposing the monolayer of the catalyst to the remote oxygen/nitrogen ($O_3$/$N_2$) plasma to form the porous aluminum oxide layer, and depositing the silanol precursor onto the aluminum oxide layer, and then purging the chamber, can be repeated to form additional layers and to provide a film having the desired thickness. The process forms a laminate structure composed of alternating thin layers (monolayers of about 3 to 10 Å (angstroms)) of aluminum oxide and thick layers of $SiO_2$. The process achieves an about 12% increase in the silicon dioxide deposition or growth rate per cycle compared to processes that do not utilize an organoaluminum catalyst layer and the oxygen/nitrogen processing step prior to depositing the silanol precursor, resulting in the deposition of an about 100 to 300 Å thick layer of silicon dioxide.

In other aspects, the invention provides integrated circuits that can include an array of memory cells and internal circuitry, electronic systems that can comprise a microprocessor and a memory device coupled to the microprocessor, and electronic systems that include a processor and an integrated circuit (e.g., a memory circuit such as a DRAM memory circuit) in communication with the processor, which incorporates an isolation structure, made according to the invention, of alternating layers of a porous aluminum oxide monolayer and an about 100 to 300 Å thick layer of silicon dioxide.

The invention is useful in forming silicon dioxide layers over features that have flat surfaces to features, such as contact openings and trenches having a high aspect ratio of up to about 20-30:1 and higher, providing good step coverage over the sidewalls and base of each feature at a low deposition temperature. A higher deposition rate of silicon dioxide results in a higher throughput and increased production output. The invention provides a useful process for forming nanofilms that are useful in applications such as fiber electronics, among others. In addition, the porous aluminum oxide ($Al_2O_3$) layer has a lower k value than dense $Al_2O_3$, which is useful in IMD applications where lower parasitic capacitance is desirable.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the context of the current application, the terms "semiconductor substrate," "semiconductive substrate," "semiconductive wafer fragment," "wafer fragment," or "wafer," will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

FIGS. 1-6 illustrate steps in an embodiment of a method of the invention for fabricating an insulative layer for a trench isolation feature in a semiconductive substrate. Other semiconductor structures than isolation trenches can also benefit from the insulative layer of the invention. Thus, the method is not limited to the specific illustrated embodiment and has broad application to a variety of applications in Integrated Circuit (IC) fabrication for shallow trench isolations (STIs), gate spacers, spacers between word lines, and buried digit line spacers, among others.

Figure 1:
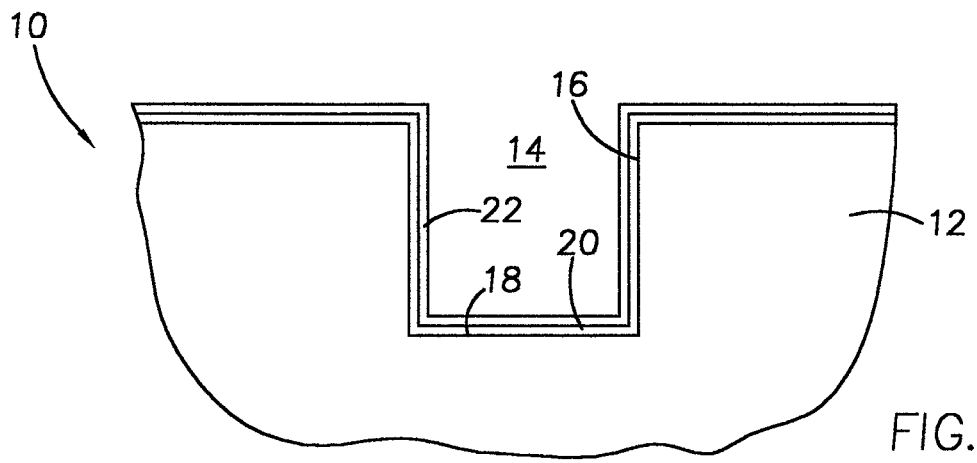
FIG. 1 is a diagrammatic, cross-sectional view of a semiconductor construction at a preliminary processing stage of an exemplary application of the present invention.

Referring to FIG. 1, an exemplary semiconductor wafer fragment at a preliminary processing step is indicated generally with reference numeral 10. The wafer fragment 10 comprises a substrate 12, which can comprise an unprocessed semiconductor wafer or other substrate, the wafer with various process layers formed thereon including one or more semiconductor layers or other formations, and active or operable portions of semiconductor devices such as transistors, capacitors, electrodes, insulators, or any of a variety of components commonly utilized in semiconductor structures. The substrate 12 can comprise a semiconductive material such as monocrystalline silicon, polycrystalline silicon, germanium, gallium arsenide, or epitaxial layers of silicon supported by a base semiconductor foundation, for example, or an insulating layer if silicon-on-insulator (SOI) or a similar technology is used. The process of the present invention has broad application to a wide variety of substrates 12. In the illustrated example, the substrate 12 comprises a semiconductive material such as monocrystalline silicon that is lightly doped with a conductivity enhancing material.

As shown, a trench 14 has been formed into the semiconductive substrate 12. The trench can be formed, for example, by forming a patterned layer of photoresist and etching the substrate 12 to form the trench 14, according to known techniques. The trench 14 includes sidewalls 16 and a bottom (base) 18. The wafer 10 further includes a pad oxide layer 20 overlying the substrate 12, and an overlying silicon nitride layer 22.

An oxide isolation structure is formed in the trench 14 by forming alternating layers of porous aluminum oxide and silicon dioxide.

Figure 2:
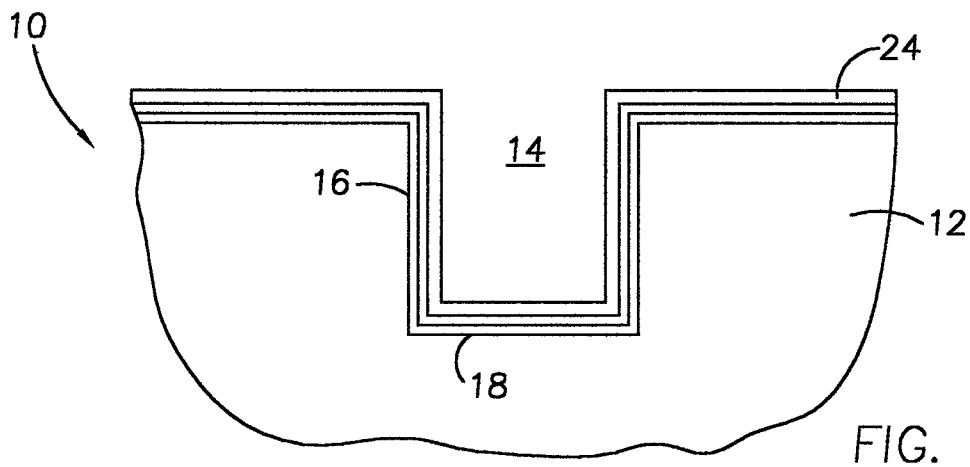
FIGS. 2-6 are views of the FIG. 1 wafer fragment at sequential processing steps subsequent to that of FIG. 1 according to an embodiment of the method of the invention.

Referring to FIG. 2, a monolayer 24 of an organoaluminum (catalyst) material (e.g., about 3 to 10 Å) is deposited over the substrate 12 and along the sidewalls 16 and bottom 18 within the trench 14. The organoaluminum monolayer 24 can be formed by atomic layer deposition (ALD) processing in a deposition chamber, which includes exposing the substrate 12 to a gaseous organoaluminum precursor to form a monolayer onto the surface with organic groups (e.g., methyl groups) pending from the chemisorbed aluminum.

The organoaluminum precursor may be any suitable organic compound that will allow the aluminum to deposit from the gas phase onto a substrate under ALD conditions and chemisorb to the surface of the substrate with organic groups (e.g., methyl groups) available for oxidation. Exemplary organoaluminum precursors include aluminum alkyls such as trimethylaluminum (TMA), triethylaluminum, triisobutylaluminum, and the like; alkylaluminum alkoxides such as triethyl(tri-sec-butoxy)dialuminum (TETBAL), and the like; and aluminum amides such as $Al_2(NEt_2)_6$, $Al_2(NEtMe)_6$, $Al_2(NMe_2)_6$, and the like.

A standard ALD process can be used to deposit the organoaluminum compound, which generally employs precursor sources that are delivered from a vaporization chamber to a reactor chamber where the deposition onto the target substrate occurs. The organoaluminum precursor can be vaporized by known methods. For example, a liquid form of the organoaluminum precursor can be placed in a bubbler and heated (if necessary) to its vaporization temperature, and the vaporized precursor material can then be either directly introduced into the reaction chamber, or transported by a carrier gas (e.g., Ar, He, etc.) passing over the bubbler or through the liquid precursor. The precursor can also be contained in a temperature-controlled vessel such as an ampoule having an outlet to deliver the vaporized precursor to the deposition chamber. For example, trimethylaluminum (TMA) can be held in an ampoule at about room temperature (about 20° C.), and pulses of the TMA vapor can be delivered through a valve into the deposition chamber.

Generally, the process parameters include a reaction chamber temperature of about 180° C.-350° C., preferably about 200° C.-320° C., and typically about 230° C., and a chamber pressure of about 0.5 Torr to 10 Torr, preferably about 1 Torr. The cycle duration (pulsing) of the organoaluminum precursor (e.g., trimethylaluminum) is typically about 1 to 5 seconds, preferably about 1 second, to deposit about a monolayer 24 of the organoaluminum compound onto the surface of the substrate 12.

The unreacted organoaluminum precursor is then purged from the surface of the substrate 12 and the deposition chamber. The purging can be conducted with an inert gas such as nitrogen ($N_2$), argon (Ar), helium (He), neon (Ne), krypton (Kr), xenon (Xe), and the like, at a flow rate of about 500 sccm to 1,000 sccm for about 1 to 30 seconds, preferably about 10 seconds.

Figure 3:
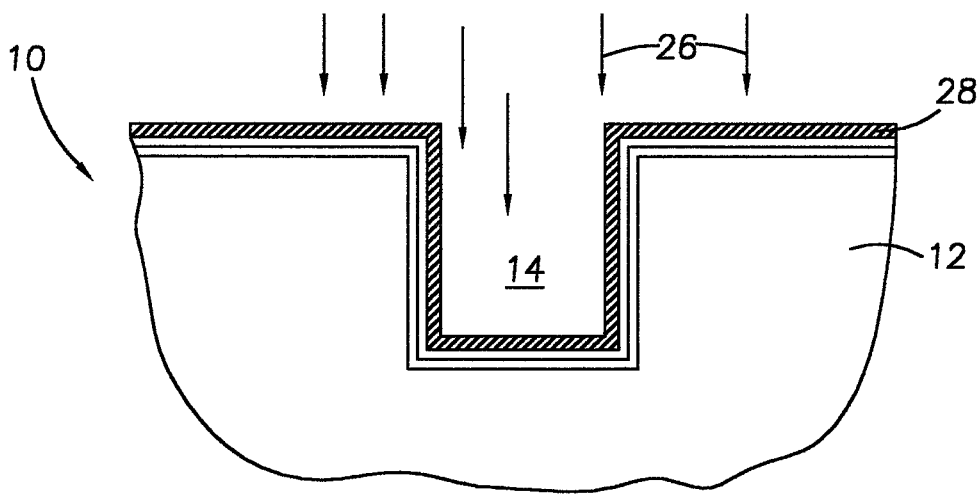

As depicted in FIG. 3, the organoaluminum monolayer 24 is then exposed to an active oxygen source and an active nitrogen source 26 to produce a roughened and porous aluminum oxide ($Al_2O_3$) layer 28 on the substrate. Preferably, the organoaluminum monolayer 24 is exposed to a remote oxygen plasma and a small amount of a remote nitrogen plasma. Exemplary oxygen and nitrogen sources include ozone ($O_3$), hydrogen peroxide ($H_2O_2$) vapor, water ($H_2O$) vapor, oxygen ($O_2$), nitrogen ($N_2$), nitrous oxide ($N_2O$), nitrogen dioxide ($NO_2$), and nitric oxide (NO), being ozone ($O_3$) and nitrogen ($N_2$) in the illustrated example.

It has been found that the presence of nitrogen in the oxygen process gas results in the desired porosity in the aluminum oxide layer 28. A preferred concentration of a remote plasma nitrogen is about 0.01% to 90% by volume, based on the total volume of remote plasma oxygen and remote plasma nitrogen, preferably about 0.1% to 10% by volume, preferably about 0.1% to 3% by volume, and more preferably about 0.01% to 1% by volume.

As an example, the oxygen/nitrogen treatment process can be conducted by remote microwave plasma using a gas mixture of ozone ($O_3$) and nitrogen ($N_2$), along with a carrier gas such as argon or helium, with an ozone flow of about 500 sccm to about 1 liter per minute, preferably about 750 sccm, to provide a gas mixture of about 12 wt % to 16 wt % ozone and about 0.5 wt % to 1 wt % nitrogen, at a reaction chamber temperature of about 180° C. to 350° C., preferably about 200° C. to 320° C., and typically about 230° C., a chamber pressure of about 0.5 Torr to 10 Torr, preferably about 1 Torr, and an RF power of about 4000 W at a frequency of about 13.5 mHz. The cycle duration (pulsing) of the remote plasma oxygen/nitrogen process can be about 6 to 10 seconds, preferably about 8 seconds. The resulting aluminum oxide layer 28 is typically about 1 to 1.5 Å thick, with an about 50% porosity.

Figure 4:
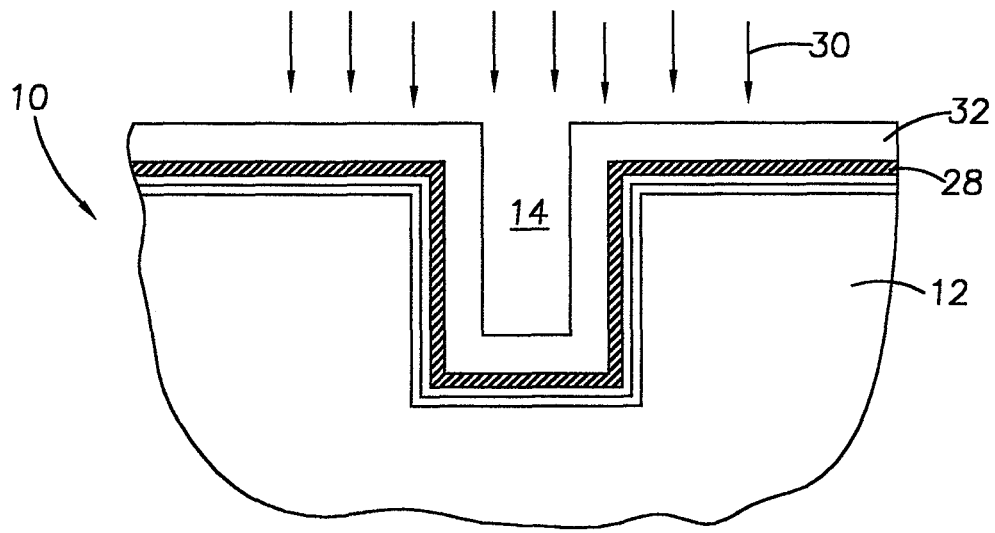

Referring now to FIG. 4, the aluminum oxide layer 28 is then exposed to a silanol precursor 30 to form a thick silicon dioxide layer 32. Exemplary silanols include alkoxysilanols, alkoxyalkylsilanols, alkoxysilanediols, and the like, including tris(alkoxy)silanol compounds, such as tris(tert-butoxy)silanol (TBOS) and tris(tert-pentyloxy)silanol, and bis(tert-alkoxy)silanediol.

The silanol precursor 30 can be pulsed into the deposition chamber in an inert carrier gas (e.g., $N_2$, He, Ar, etc.) at a silanol flow rate of about 100 sccm to 500 sccm per minute, typically about 300 sccm per minute, a reaction chamber temperature of about 180° C. to 350° C., preferably about 200° C. to 320° C., and typically about 230° C., and a chamber pressure of about 0.5 Torr to 10 Torr, preferably about 1 Torr. The silanol precursor 30 can be delivered into the reaction chamber by known methods, for example, by vaporizing the silanol in an ampoule or bubbler at 70° C. to 100° C., typically about 80° C., and introducing the vaporized silanol in combination with a carrier gas into the chamber. The cycle duration (pulsing) of the silanol precursor 30 is about 1 to 60 seconds, preferably about 20 seconds.

The process results in a high deposition (growth) rate of the silicon dioxide of about 12% compared to a typical ALD process and processes that do not treat the organoaluminum monolayer 24 with an active oxygen/nitrogen source(s) (e.g., the remote oxygen/remote nitrogen plasma treatment) to form the porous aluminum oxide layer 28 prior to depositing the silanol precursor 30 onto the substrate 12, resulting in a thick layer 32 of silicon dioxide of about 100 to 300 Å per cycle. Process conditions such as the reaction temperature, pressure, and silanol flow rate, can be optimized by a person skilled in the art to vary the thickness of the silicon dioxide layer 32.

After the formation of the silicon dioxide layer 32, the unreacted silanol precursor 30 is then purged from the surface of the substrate 12 and the deposition chamber. The purging can be conducted using an inert gas (e.g., Ar, etc.) at a flow rate of about 500 sccm to 1,000 sccm for about 1 to 30 seconds, preferably about 10 seconds.

Figure 5:
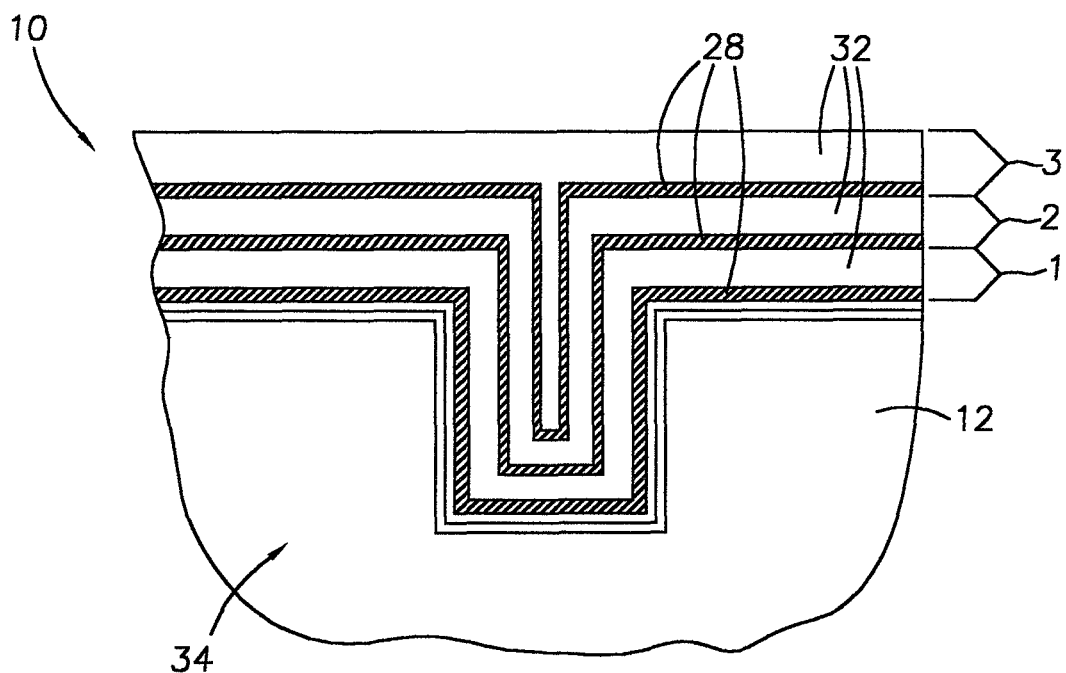

The cycle sequential steps can then be repeated to form additional layers of the porous aluminum oxide layer 28 and the silicon dioxide layer 32, as depicted in FIG. 5, which indicates the completion of three cycles (labeled "1", "2", and "3") to fill the trench 14 and form an isolation structure 34. The resulting structure is a laminate of alternating thin layers of porous aluminum oxide 28 and thick layers of silicon dioxide ($SiO_2$) 32.

Figure 6:
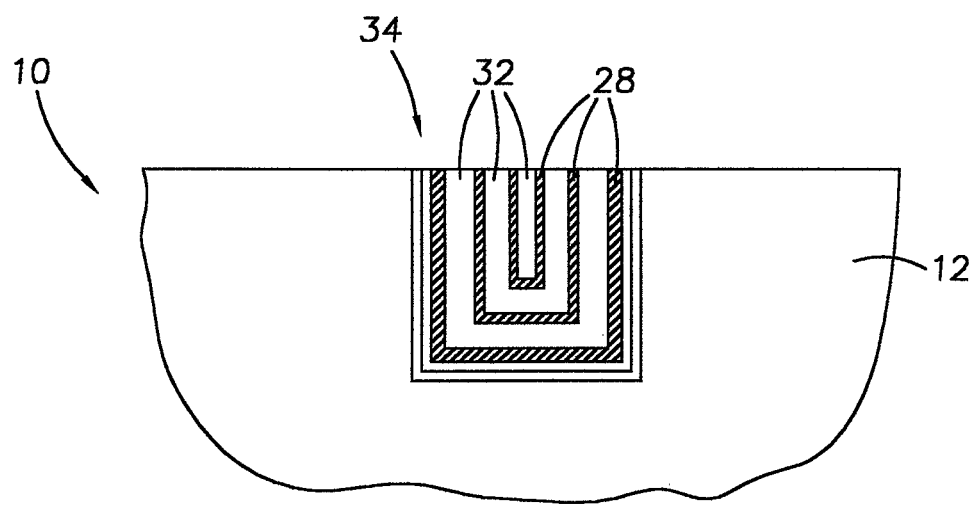

As depicted in FIG. 6, further processing can be conducted, including stripping off excess of the oxide fill material formed above the surface of the substrate 12, for example, using a known chemical-mechanical polishing (CMP) technique, or other techniques such as wet etching and/or dry etching.

The process according to the invention, which utilizes the formation of a porous aluminum oxide layer, advantageously results in a substantially increased growth rate of the silicon dioxide layer, and also offers the advantage of filling a narrow space, e.g., shallow trench isolation (STI) areas or other openings having a high aspect ratio up to about 20-30:1, for example. The process results in a silicon dioxide deposition rate that is 12% higher than the rate of previously known deposition processes, and the formation of a thick layer of silicon dioxide (e.g., about 120 Å) with each deposition cycle (e.g., TMA deposition, silanol deposition).

The resulting isolation structure 34 (e.g., STI) can be used in a variety of applications including, for example, programmable memory devices, programmable resistor and capacitor devices, optical devices, and sensors, among others.

Figure 7:
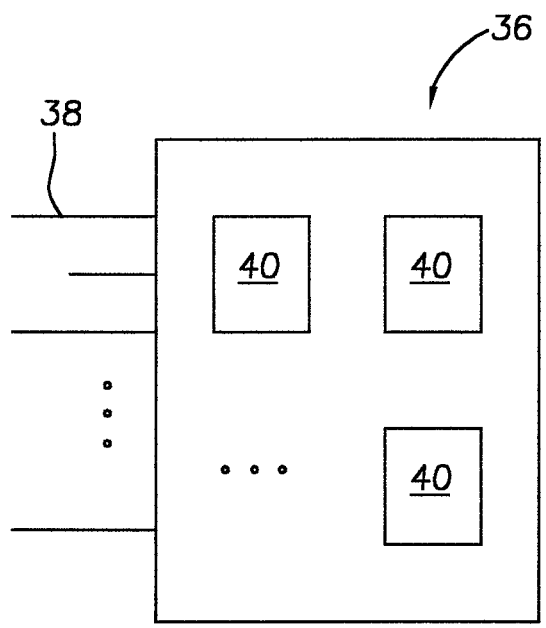
FIG. 7 is a block diagram of a circuit module according to an embodiment of the present invention.

FIG. 7 is a block diagram of an embodiment of a circuit module 36 in which the present invention can be incorporated. Such modules, devices and systems (e.g., processor systems) incorporating the module are described and illustrated in U.S. Pat. Nos. 6,437,417 (Gilton) and 6,465,828 (Agarwal), the disclosures of which are incorporated by reference herein. In brief, two or more dies may be combined into a circuit module 36 to enhance or extend the functionality of an individual die. Circuit module 36 may be a combination of dies representing a variety of functions, or a combination of dies containing the same functionality. One or more dies of the circuit module 36 can contain circuitry, or integrated circuit devices, that include at least one isolation structure in accordance with the embodiments of the present invention. The integrated circuit devices can include a memory cell that comprises a structure as discussed in the various embodiments in accordance with the invention.

Some examples of a circuit module include memory modules, device drivers (on a BIOS or EPROM), power modules, communication modems, processor modules, and application-specific modules, and may include multilayer, multichip modules. Circuit module 36 may be a subcomponent of a variety of electronic systems, such as a clock, a television, a cell phone, a personal computer, an automobile, an industrial control system, and an aircraft, among others. Circuit module 36 will have a variety of leads 38 extending therefrom and coupled to dies 40 providing unilateral or bilateral communication and control.

The circuit module 36 can be incorporated, for example, into an electronic system that comprises a user interface, for example, a keyboard, a monitor, a display, a printer, speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent and, optionally, user interface components, and other associated components such as modems, device interface cards, etc. Examples of memory circuits include, but are not limited to, DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDRSDRAMo (Double Data Rate SDRAM), as well as Synchlink or Rambus DRAMs and other emerging memory technologies.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for forming a dielectric material on a substrate, the method comprising:
   forming an organoaluminum monolayer on a substrate;
   exposing the organoaluminum monolayer to oxygen and nitrogen gases to form a porous aluminum oxide monolayer; and
   exposing the porous aluminum oxide monolayer to a silanol precursor gas to form thereon silicon dioxide at a thickness of about 100 angstroms to 300 angstroms.

2. The method of claim 1, wherein exposing the organoaluminum monolayer to oxygen and nitrogen gases comprises exposing the organoaluminum monolayer to from 0.01% by volume to 10% by volume nitrogen, based on a total volume of oxygen and nitrogen.

3. The method of claim 1, wherein exposing the organoaluminum monolayer to oxygen and nitrogen gases comprises exposing the organoaluminum monolayer to from 12% by weight to 16% by weight ozone gas and from 0.5% by weight to 1% by weight nitrogen gas.

4. The method of claim 1, wherein the oxygen gas is selected from the group consisting of ozone, hydrogen peroxide vapor, water vapor and oxygen.

5. The method of claim 1, wherein the nitrogen gas is selected from the group consisting of nitrogen, nitrous oxide, nitrogen dioxide and nitric oxide.

6. The method of claim 1, wherein exposing the organoaluminum monolayer to oxygen and nitrogen gases comprises exposing the organoaluminum monolayer to ozone and nitrogen.

7. The method of claim 1, wherein exposing the organoaluminum monolayer to oxygen and nitrogen gases comprises exposing the organoaluminum monolayer to an oxygen plasma and a nitrogen plasma.

8. The method of claim 1, wherein forming an organoaluminum monolayer on a substrate comprises exposing the substrate to a gaseous organoaluminum precursor.

9. The method of claim 8, wherein the gaseous organoaluminum precursor is selected from the group consisting of aluminum alkyls, alkylaluminum alkoxides and aluminum amides.

10. The method of claim 8, wherein the gaseous organoaluminum precursor comprises an aluminum alkyl selected from the group consisting of trimethylaluminum, triethylaluminum, and triisobutylaluminum.

11. The method of claim 8, further comprising purging excess gaseous organoaluminum precursor from a reaction chamber containing the substrate.

12. The method of claim 1, wherein forming an organoaluminum monolayer on a substrate comprises depositing an organoaluminum precursor gas under atomic layer deposition conditions.

13. The method of claim 12, wherein forming an organoaluminum monolayer on a substrate comprises exposing the substrate to the organoaluminum precursor gas for from 1 second to 5 seconds.

14. The method of claim 1, wherein exposing the organoaluminum monolayer to oxygen and nitrogen gases comprises exposing the organoaluminum monolayer to the oxygen and nitrogen gases for from 6 seconds to 10 seconds.

15. The method of claim 1, wherein exposing the porous aluminum oxide monolayer to a silanol precursor gas comprises exposing the porous aluminum oxide monolayer to the silanol precursor gas for from 1 second to 60 seconds.

16. The method of claim 1, wherein the silanol precursor gas is selected from the group consisting of alkoxysilanols, alkoxyalkylsilanols and alkoxysilanediols.

17. A method for forming a dielectric material on a substrate, the method comprising:
   depositing an organoaluminum precursor gas on a substrate by atomic layer deposition to form an organoaluminum monolayer;
   exposing the organoaluminum monolayer to oxygen and nitrogen gases to form a porous aluminum oxide monolayer; and
   exposing the porous aluminum oxide monolayer to a silanol precursor gas to form thereon silicon dioxide at a thickness of about 100 angstroms to 300 angstroms.

18. The method of claim 17, further comprising removing non-absorbed organoaluminum precursor gas from a chamber containing the substrate.

19. A method for forming a dielectric material on a substrate, the method comprising:
   forming an organoaluminum monolayer by atomic layer deposition on the substrate from an organoaluminum precursor gas;
   exposing the organoaluminum monolayer to oxygen and nitrogen gases to form a porous aluminum oxide monolayer;
   exposing the porous aluminum oxide monolayer to a silanol precursor gas to form thereon silicon dioxide at a thickness of about 100 angstroms to 300 angstroms; and
   repeating forming the porous aluminum oxide monolayer and forming the silicon dioxide to form a laminate of alternating porous aluminum oxides and 100 angstrom-thick to 300 angstrom-thick silicon dioxide.

20. The method of claim 19, further comprising, prior to repeating forming the porous aluminum oxide monolayer and forming the silicon dioxide, purging excess silanol precursor gas from a chamber containing the substrate.

21. A method for forming a dielectric material on a substrate, the method comprising:
   sequentially pulsing an organoaluminum catalyst precursor gas to deposit a monolayer of the organoaluminum catalyst over the substrate, oxygen and nitrogen source gases to convert the organoaluminum catalyst monolayer into porous aluminum oxide, and a silanol precursor gas for a cycle duration effective to form silicon dioxide at a thickness of about 100 angstroms to 300 angstroms on the porous aluminum oxide.

22. The method of claim 21, further comprising repeating the sequential pulsing of the organoaluminum catalyst precursor gas, the oxygen and nitrogen source gases, and the silanol precursor gas to form the dielectric material.

* * * * *